(12) United States Patent
Lu (10) Patent No.: US 11,431,303 B2
(45) Date of Patent: Aug. 30, 2022

(54) COMPACT AUDIO POWER AMPLIFIER

(71) Applicant: Xiaozheng Lu, Dallas, TX (US)

(72) Inventor: Xiaozheng Lu, Dallas, TX (US)

(*) Notice: Subject to any disclaimer, the term of this patent is extended or adjusted under 35 U.S.C. 154(b) by 0 days.

(21) Appl. No.: 16/659,105

(22) Filed: Oct. 21, 2019

(65) Prior Publication Data
US 2022/0173705 A1 Jun. 2, 2022

Related U.S. Application Data

(60) Provisional application No. 62/753,709, filed on Oct. 31, 2018.

(51) Int. Cl.
*H03F 3/217* (2006.01)
*H03F 3/187* (2006.01)
*H05K 1/02* (2006.01)

(52) U.S. Cl.
CPC ............ *H03F 3/217* (2013.01); *H03F 3/187* (2013.01); *H05K 1/0209* (2013.01); *H03F 2200/03* (2013.01); *H03F 2200/351* (2013.01)

(58) Field of Classification Search
CPC ...... H03F 3/217; H03F 3/187; H03F 2200/03; H03F 2200/351; H05K 1/0209
USPC ........................................ 330/10, 207 A, 251
See application file for complete search history.

(56) References Cited

U.S. PATENT DOCUMENTS 7,332,962 B2 * 2/2008 Wu ........................ H03F 3/2173
330/10
9,271,430 B2 * 2/2016 Snider .................. H05K 9/0043

* cited by examiner

*Primary Examiner* — Hieu P Nguyen
(74) *Attorney, Agent, or Firm* — Jonathan A Claypool (57) ABSTRACT

This invention provides compact Power Amplifiers with improved efficiency of the circuitry and improved heat dissipation, together achieved much smaller enclosure size for use in modern installations requiring reduced height such as between the thin flat TV and wall, under the table or on the projector pole or in ceiling box and the like.

12 Claims, 6 Drawing Sheets

COMPACT AUDIO POWER AMPLIFIER

FIELD OF THE INVENTION

The invention relates to new technologies and designs for Audio Power Amplifiers.

This application claims priority to U.S. Provisional Application No. 62/753,709, filed Oct. 31, 2018.

BACKGROUND

Audio Power Amplifiers ("Power Amp" or "Power Amps") have been widely used in the audio video industry for over one hundred years, and have evolved going through the class A, class AB and currently to class D technologies. Class A uses full constant direct current (DC) bias for the one output transistor, consumes the full power even when there's no input signal, and thus has often far less than 25% efficiency. Class B uses two push-pull transistors in the output circuit with no DC bias, then does not consume power when no input signal and so is more efficient but has crossover distortions near zero voltage. Class AB adds a small DC bias to overcome the distortion, in the expense of efficiency, and its efficiency is much less than 75%. Class D changes the analog signal into Pulse Width Modulation (PWM) square waves, so the output transistors only work in either fully on or fully off stages, which in theory does not consume power on the transistors. In reality, the transistors can't change between on and off instantly, so they still generate heat. This lowers the efficiency of the Class D amplifiers.

The Class D amplifiers use self-generated triangle reference(s) and comparators to convert the input signal into PWM square waves, such PWM square waves need to be removed at the output of the Power Amps. Most of the prior art Class D Power Amps use filters, for example an inductor (L) and a capacitor (C) together, or LC filter, to filter out the square wave at the output before sending to the speakers. The inductor (L) and capacitor (C) are rather large in size, thus increase the Power Amp size. The inductor (L) also generates significant heat, thus further decreases the Class D amplifier efficiency to below 85%.

Prior art attempts to solve this problem by using 4 switches and 1 special purpose controller to achieve no voltage differences between the two speaker terminals when no input signal, thus eliminates the needs for an output LC filter. But the 4 switches and 1 special purpose controller means these circuits become proprietary to the few manufacturers who own the patents of this configuration and are limited to the offers by such manufacturers who provide commercial IC chips suitable for these uses. For example, if the only proprietary IC chips that are available from these few manufacturers are only from 20 to 100 W, then the available Power Amp offers are limited to this power range and are also expensive due to higher costs for such proprietary IC chips, and importantly are not available for any bigger power needs. Also, it is desirable for such filterless Power Amps to be used in audible audio range, subsonic range, and the radio frequency (RF) range. If the only proprietary IC chips are available from these few manufacturers are only for the audible audio range, then the available offerings for such Power Amp would be limited to audible audio range and would also generally be expensive, and not for subsonic range or RF range applications.

Some prior art splits the input analog signal into two, one in phase analog signal feeds to top half of the dual switching amplification circuits, the other reverse phase analog signal feeds the bottom half of the circuits. Both analog signal amplitudes are determined by the 4 resister values in this split operational amplifier (or Op Amp) circuit. The commonly available resister tolerances are 20%, 10% and 5%, and the expensive high precision resister's tolerance is 1%. This means the two analog signal amplitudes after the split Op Amp can be different as much as 1% or more, thus 1% or more distortion, if there are no feedback loops.

Some other prior art uses two reference wave generators to generate two triangle reference waves. There's no synchronization between these two generators, thus the two reference waves won't be completely mirrored in amplitude and phase. As a result, the square wave generated for the top switching amplification circuits won't be identical to the square wave generated for the bottom switching amplification circuits when no input signal, which means distortions, if there are no feedback loops.

Other prior art attempts to solve this problem by using a feedback loop from the output stage to the input stage to cancel out the output waveform errors thus to reduce the distortions. However, any feedback loops have time delays, and such a solution would be problematic and would introduce more distortions on complex and fast changing input signals.

Still other prior art attempted to solve this problem by using one or more added triangle reference waves that shift based on the output signal so it can mask the extra square waves in output. Similar to the method above, any feedback loops have time delays; they would introduce more distortions on complex and fast changing input signals. Further, to compensate for the complex and large swinging input signals, this method may require one to add 3, 4 or even 5 extra triangle feedback loops for comparison and time shifting, making the circuits too complex and possibly ineffective. More feedback loops, gives more potential added distortions for complex input signals due to added time delays. Thus, prior art solutions are deficient to date and have not achieved the purpose of the present invention as set forth below.

The most common enclosure size for the Power Amps with the total output power rating between 100 W to 500 W is 17×7×14 inches for adequate heat dissipation. The smallest Power Amp commercially available to date is 1.75 inch in height, and cannot be made shorter than this height because the components on the PCBs take up to half of that height, and the enclosure must be at least 1.75 inch tall to leave an adequate air channel on top of the PCB inside the enclosure for the air to flow through to cool the components. The achieved output power of the 1.75 inch tall Power Amps are only about 24 W due to inefficacy and inadequate heat dissipation. Also, air ventilation cooled products must have air entrance and exit for the air to flow through to achieve cooling, and must have heat sinks that typically have many fine "fingers" or "fins" with very narrow air channels in between to max out the total area for the heat exchange. These narrow air channels eventually get clogged by dust. The fan added to this ventilation cooling system accelerates such dust clogging. When the dust clogging happened, the air flow is greatly reduced to the outline of the heat sink only. As a result, the products overheat and fail. This is the number one reason for product failures.

This common enclosure size of 17×7×14 inches or similar is fine for Power Amps mounted inside equipment racks. However, it is too large for applications where the Power Amp needs to be mounted between the thin flat panel TVs and the wall, mounted under the tables, or mounted on projector poles. Thus, Power Amps in much smaller enclosure sizes especially ones requiring a thin Power Amp with a maximum of one inch height are widely needed to adapt to demands for such applications where space and heat dissipation are constrained.

Current prior art Power Amps are generally large (e.g. 17 inch width×7 inch height×14 inch depth) and are designed with air ventilation heat sinks to dissipate heat from heat generating integrated circuit (IC) chips and also to fit equipment racks. Such prior art installations require an equipment rack hidden from sight and far away from the TV or other device to mount the Power Amp, and long audio input cables and speaker cables pulled through the wall or under the floor in between the TV, speakers and the Power Amp. This is undesirable for most modern homes, board rooms, offices and other commercial settings where space is often a premium and installation labor is expensive.

To make the Power Amps in significantly smaller in sizes, two major breakthroughs are needed: one is to make the Power Amp circuit more efficient thus generating less heat; two is to sink the heat from the heat generating components much more effectively given that the much smaller enclosure size means much less air flow and much less surface to radiate and dissipate heat from the Power Amp.

Power Amps need multiple line inputs for connecting to multiple source devices. Many Power Amps use built in switchers to select which signal to play from these inputs. This requires additional control devices to choose which input to switch to; this switching often causes popping sounds; the switching method also does not allow the audio fade in and fade out effects.

Power Amps for use in conference rooms and classrooms often need a microphone (or "Mic") input to mix the presenter's voice into the program audio, and also need separate microphone gain controls from the line input gain controls.

Many Power Amps' microphone input gain is also controlled by the main volume control ("Volume Control"). This is not desirable, because if the users increase volume to a certain point, very annoying speaker to microphone feedback can occur during presentations.

Most of the Power Amps now use the digital Volume Controls, by pressing the volume up and down buttons or by turning a digital rotary encoder knob. Each button press achieves one step in volume change. Rotating passing one contact position in a rotary encoder also achieves one step in volume change. There's always a conflict in achieving very fine steps of the volume change and quick changes through the volume range. For example, if the rotary encoder has 16 steps in one revolution, and the digital Volume Control is designed to cover the whole volume range in one revolution, then there are only 16 steps in the whole volume range, each step is a relatively big jump in volume change. If the digital Volume Control is designed to cover the whole range in 100 fine steps, then the users need to rotate the encoder more than 6 full rotations to change volume from minimum to maximum.

SUMMARY

Embodiments of the current invention comprises a compact audio Power Amplifier with very small overall enclosure size, in one of the embodiments the Power Amp is about 4 inch width, about 1 inch height, about 3 inch depth or about 100 times reduction (100×) in enclosure volume from common prior art Power Amps. Importantly, embodiment Power Amps still are able output a robust approximately 100 W of total audio power suitable for common sized conference room, classrooms, and fit in the tight space behind flat panel TVs, under tables or on projector poles or alternately be mounted in industry standard equipment rack.

Embodiments of the current invention achieves a small size and maintains a large Power Amplification by sinking the heat from the most heat generating IC chips directly onto the metal or solid ceramic enclosure, or other conductive enclosure, thus it does not need any internal air ventilation, or no open windows on the enclosure, or any fan to circulate air for dissipating heat from the Power Amp. This is crucial to commercial embodiments of the invention to achieve about one-inch height of the Power Amp, because at this height, the electronic components standing up from the printed circuit board (PCB) would occupy almost the full height of the Power Amp's internal space and would not allow any air flow inside the enclosure. In other embodiments the Power Amp may have the width, height, and depth reduced or increased by increments of about 0.0625 inches or 1.5875 mm (1/16 inch) incrementally if internal circuitry can be reduced in size or if power needs mandate a larger Power Amp output.

In specific embodiments the Power Amp height is about 0.5 inches to 1 inch; about 1 inch to about 1.75 inches; about 1.75 inches to about 3.5 inches; about 3.5 inches to about 5.25 inches; or about 5.25 inches to about 7 inches. In specific embodiments the Power Amp width is about 1 inch to about 17 inches (typical width of equipment rack for electronics width is about 17 inches depending if space is allotted on the sides); about 1 inch to about 2 inches; about 2 inch to about 4 inches; or 4 inches to about 8 inches; or 8 inches to about 16 inches. In most embodiments the depth may be anywhere from 1 inch to 25 inches generally increasing in 1 inch increments depending on needs for Power Amps. In these specific Power Amp embodiments power can be from about 1 to about 25 W (mini amps); about 25 to about 150 W (small amps); about 150 to about 1,000 W (mid amps); or about 1,000 to about 20,000 W (big amps).

In all embodiments the whole enclosure now functions as an efficient heat radiator despite its compact size. A skilled engineer would recognize metal enclosures with highly thermal conductive properties (i.e. titanium, copper, or alloys, steel, or otherwise) would represent specific embodiments. Other embodiment enclosures could be ceramic, or other conductive material (e.g. composite plastic or other hybrid materials).

The novel design for embodiment compact Power Amp dramatically improves the heat dissipation from the main IC chips and makes the Power Amp much smaller and more reliable, because heat is the primary killer of any electronics products. The hotter the product, the shorter the life expectation and greater the failure rate. Thus, longer life is expected for commercial embodiment Power Amps.

Embodiments of the current invention further employ a novel Super Class D Power Amp design where the dual parallel switching amplification Class D work in phase (or push-push, not in reverse phase or push-pull), and when no input signals, each circuit outputs a fifty percent (50%) duty cycle square wave output signal in the same phase and no need for large LC filters. Such embodiment filterless Power Amps can be used to make devices with max output power from 1 W to 20,000 W using a variety of general purpose IC chips, transistors and other circuitry as opposed to proprietary IC chips and circuitry. The two speaker terminals are connected to the outputs of these two circuits respectively, taking the differential signals between these two circuits. When there's no input signal, there is no differential voltage between the two speaker terminals, thus there is no current going through the speaker attached to the Power Amp. As a result, the need for the output LC filter is eliminated, and no more heat is generated from the inductor "L". This further improves the efficiency and reduction of the circuit board size.

In addition, embodiments of the current invention does not invert the input analog signal to the bottom circuits of the dual parallel switching amplification circuit, rather it splits the input analog signal directly to the top and bottom circuits, thus maintaining the analog signal to the top and bottom circuits to be absolutely identical, eliminating one area where the distortion could be introduced.

Further, embodiments of the current invention only use one triangle reference generator, and split the triangle reference into two, one to feed the top circuits, one to feed the bottom circuits via an inverter. This guarantees the two triangle references to be absolutely identical, eliminating another area where the distortion could be introduced.

With these two novel design features that eliminating distortions, embodiments of this current invention's circuits do not need feedback loops to reduce the distortion, thus eliminating many potential new distortions introduced to the Power Amp by the feedback loops with complex input signals due to the time delays of any feedback loops.

Even further, embodiments of the current invention does not need to use any proprietary 4 switches and 1 special purpose controller design used in some of the prior art which limits the availability and scope of the possible product applications, rather embodiments can use two general purpose amplifiers to form the dual parallel switching amplification circuits, just by adding the one triangle reference generator and the circuits to split it into two triangle references in reverse phase. This extends embodiment Power Amp to applications where such devices can be used from 1 W to 20,000 W output power, Power Amps in audible audio range, or supersonic range, or radio frequency (RF) range, and reduce the component costs significantly.

Embodiments of the current invention compact Power Amp may further employ two small filters for each channel, where one filter is placed from the positive lead of the speaker output to the ground, and the other filter is placed from the negative lead of the speaker to the ground. These filters are to reduce the EMI ("Electromagnetic Interference") emission through the speaker wires, not to filter out the switching square waves, thus such Power Amp embodiments can still be called "filterless".

Embodiments of the current invention compact Power Amp can have multiple line inputs whose left channels are mixed together, where right channels are mixed together, respectively, with a line gain control ("Line Gain"). This design eliminates the needs for an audio switcher and its control device, and also eliminates the pop sound typical in switching, and also enables sound to fade in or out from one input to another.

Embodiments of the current invention compact Power Amp also can have a microphone input with microphone gain control ("Mic Gain"), and this signal path is not controlled by the main Volume Control, thus a trained engineer can adjust the Mic Gain Potentiometer (or "Pot") once to the point right before the speaker to microphone feedback happens and leave the setting there. The end users will never be able to trigger feedback in the normal usage no matter how he/she sets the main Volume level.

Embodiments of the current invention compact Power Amp uses variable DC voltage for remote Volume Control. The user uses an external rotation Pot connected to the Power Amplifier and can make full volume change from minimum to maximum in one quick turn in less than one full revolution, and also can make infinite small volume changes by turning the Pot slightly. The same remote Volume Control circuit can also serve as mute function for PA (Public Addressing) or emergency audio duck.

Embodiments include a compact audio Power Amplifier comprising a thermal conductive enclosure comprising without openings for ventilation; an interior; at least one thermal conducting material wherein the material are chosen from the group consisting of, metal, alloy, ceramic, plastic, and hybrid materials having at least one side, each side having an inner and outer surface; a compact circuit board comprising at least one flat surfaces for heat dissipating and circuitry; and at least one thermal conductive component or layer that transfers heat from the components on the at least one flat surfaces of the circuitry on the circuit board to the inner surface of the thermal conductive enclosure with the at least one component or layer by direct contact, wherein the at least one component or layer of thermal conductive material is soft or hard or a combinations thereof. In some embodiments there is no fan in the enclosure. In other embodiments the enclosure has several or 6 surfaces.

Embodiments of the compact circuit board comprise a plurality of audio inputs; a plurality of speaker outputs; and a plurality of gain controls. Embodiments include circuit board with circuitry comprising multiple audio inputs selected from a group consisting of a balanced input, unbalanced input, and a microphone input. In some embodiments the audio inputs balances input, unbalanced input and microphone inputs are mixed together via the circuitry on the circuit board. The circuit board may also include a remote Volume Control circuit that uses external Pot to supply a variable DC voltage to control the volume in specific embodiments. In some embodiments the external remote Volume Control circuit for the Volume Control may include a volume Pot, a short circuit prevention Resister and a mute switch ("Mute Switch"). Embodiments also include added circuitry for separated Line Gain and Mic Gain adjustment Pots. In these embodiments Mic output signal strength from the Mic input is only controlled by the Mic Gain control and not by the Volume Control, while the output signal strength from the balanced/unbalanced line and unbalanced line inputs are controlled by both the Line Gain control and Volume Control.

In preferred embodiments the compact audio Power Amplifier circuitry includes a Super Class D Power Amplification circuit, the Super Class D Power Amplification circuit has two parallel switching amplification circuits per audio channel, one analog splitter or simply a copper wire junction, wherein the analog splitter or simply a copper wire junction splits the input analog signal into two identical analog signals to feed the two parallel switching amplification circuits, one triangle reference generator, where the triangle reference generator feeds the reference to the two parallel switching amplification circuits in reversed phase, and where the circuits output square wave signals that are in phase, and are identical in wave width for every cycle when no input signal, thus no differential signals are present for the speaker connected between the outputs of these two circuits, and no switching square wave LC filter is needed.

DETAILED DESCRIPTION

Front Panel Features

Figure 1:
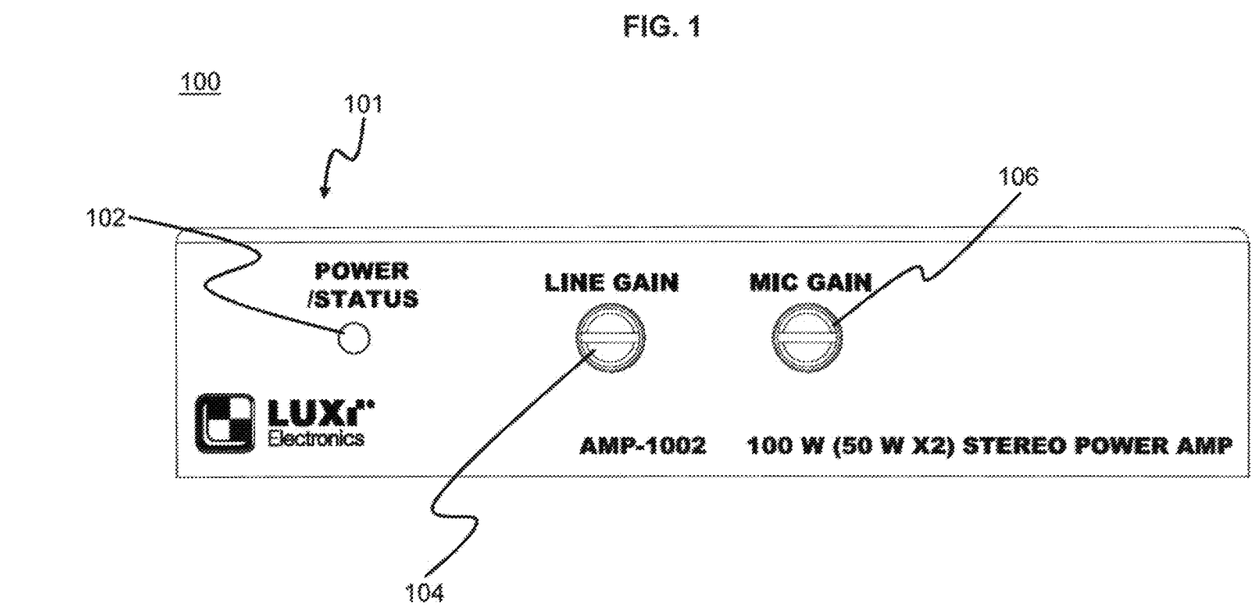
FIG. 1 schematically shows an example illustration of the current invention compact audio Power Amplifier's front panel.

Referring to FIG. 1, shown schematically is the front panel of an embodiment of the current invention for a compact Power Amp 100. This device is a compact rectangular shape with a front and rear panel for operation, though other shapes are contemplated (e.g. rhomboid, rectangular, oval, circular). The front panel 101 consists Power/Status indication LED 102, which when lit, for example, in green when normal, red when there's a fault (protection), and amber when in standby mode. The Line Gain Pot 104 sets the line input signal gains; the Mic Gain Pot 106 sets the microphone input signal gains. Other embodiments can have no LED, 2 or more LED, with different color indications. Other embodiments can have one gain Pot, 3 or more gain Pots, with different markings.

Rear Panel Features

Figure 2:
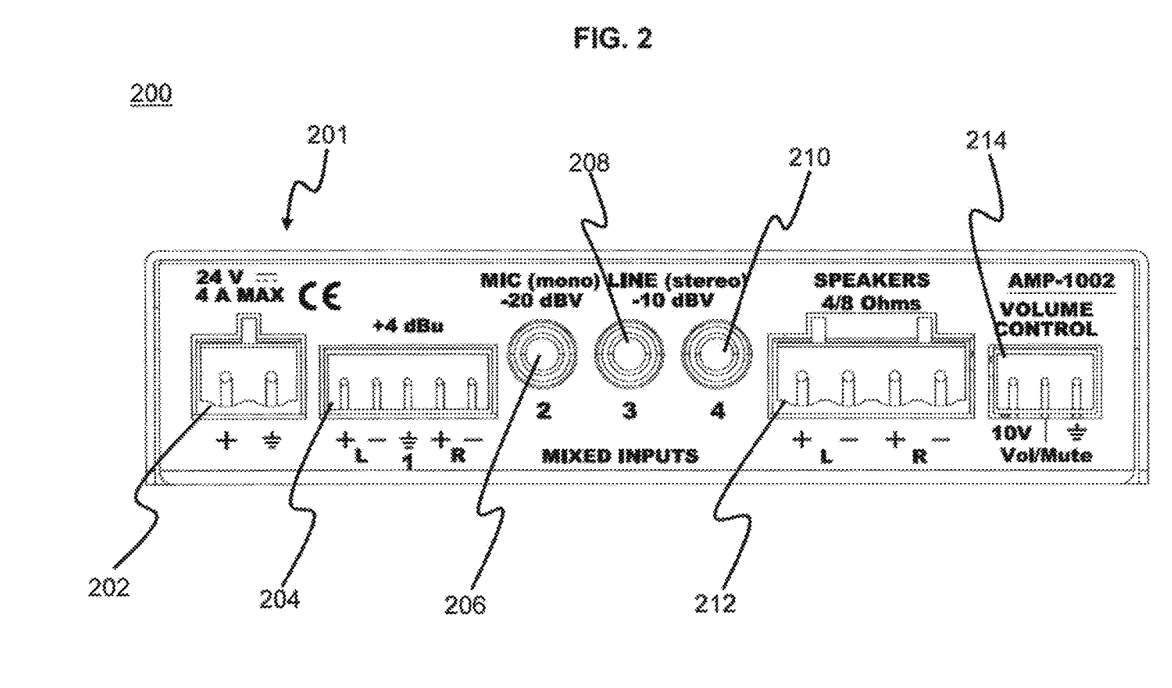
FIG. 2 schematically shows an example illustration of the current invention compact audio Power Amplifier's rear panel.

Referring to FIG. 2, in light of FIG. 1, shown schematically is the rear panel of the embodiment of the current invention compact Power Amp 200. The rear panel 201 consists a DC power input connector 202, Balanced/unbalanced line level input connector 204, Microphone input connector 206, two additional Line level input connectors 208 and 210, Speaker output connector 212 and remote Volume Control connector 214. Other embodiments can have an AC power input connector, no Microphone input connector, no balanced input connector, 1 or 3 or more line input connectors, in different connector types. Still other embodiments can have 70 V or 100 V speaker outputs.

The left channel signals from the Line level inputs 204, 208 and 210 are mixed together inside the embodiment Power Amp devices, and further the right channel signals from these three (3) connectors are also mixed together, and controlled by the Line Gain Pot 104 on front panel and the Volume Control 214 on rear panel.

The microphone input signal is only controlled by the Mic Gain Pot 106 on front panel and is NOT controlled by the Volume Control 214 on the rear panel.

PCB to Metal Enclosure Heat Sinking

Figure 3:
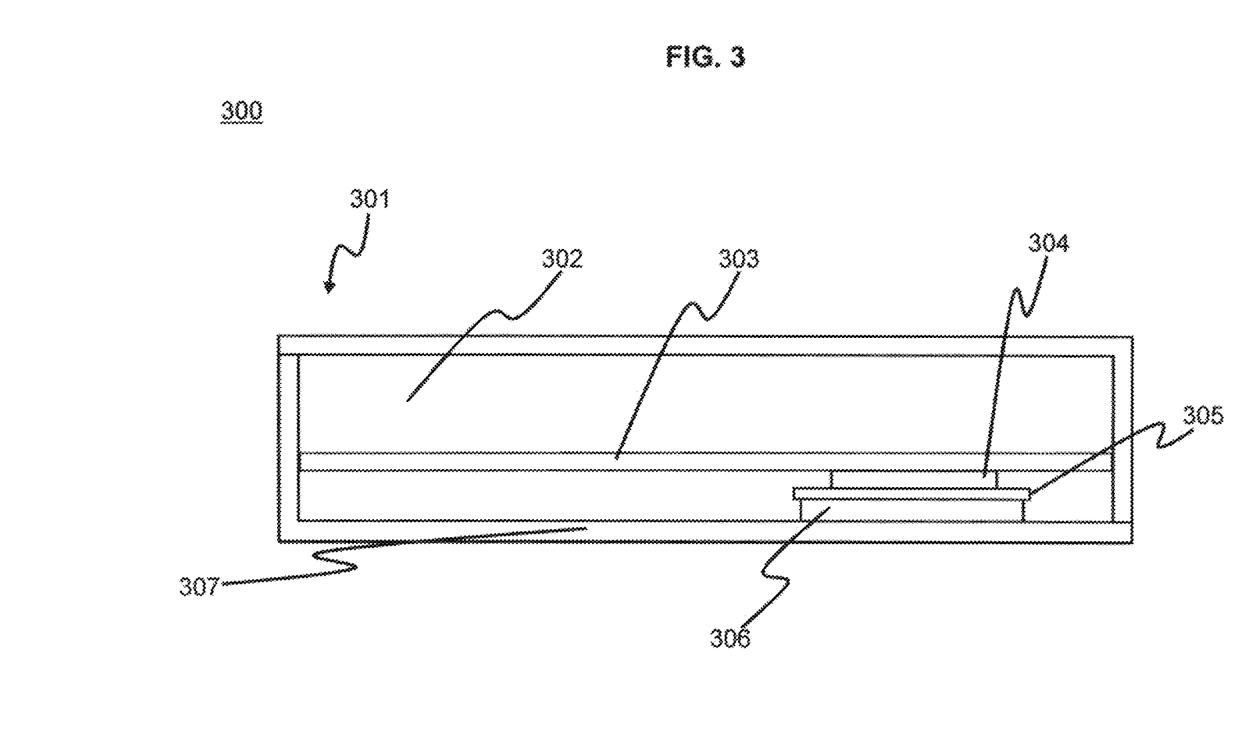
FIG. 3 schematically shows an example illustration of the current invention compact audio Power Amplifier's heat dissipation design that sinks heat from the main IC chips directly to the metal enclosure.

Referring to FIG. 3, shown schematically is the PCB ("Printed Circuit Board") to enclosure heat sinking mechanical design 300 of the current invention compact Power Amp. The metal or other composition enclosure 307 is sealed without ventilation windows; the inner air 302 is not flowing and so does not dissipate heat generated from the PCB. In one embodiment, the main heat source IC chip 304 is soldered on the circuit board 303. At least one thermal conductive components, which are in some embodiments, where one can be a soft rubber pad or thermal paste layer 305 and one hard metal or ceramic block 306 are tightly sandwiched between the heat source IC chip 304 and the inner surface of the metal enclosure 307, to transfer the heat from the heat source IC chip to the metal enclosure. Other embodiments for the enclosure 307 can be solid ceramic or composites or hybrids made from plastics, alloys, hybrid materials and the like, each contemplated with superior thermal conducting properties, and the thermal conductive components 305 and 306 can be one layer, two layer, three layers, or more.

Internal Circuit Block Diagram

Figure 4:
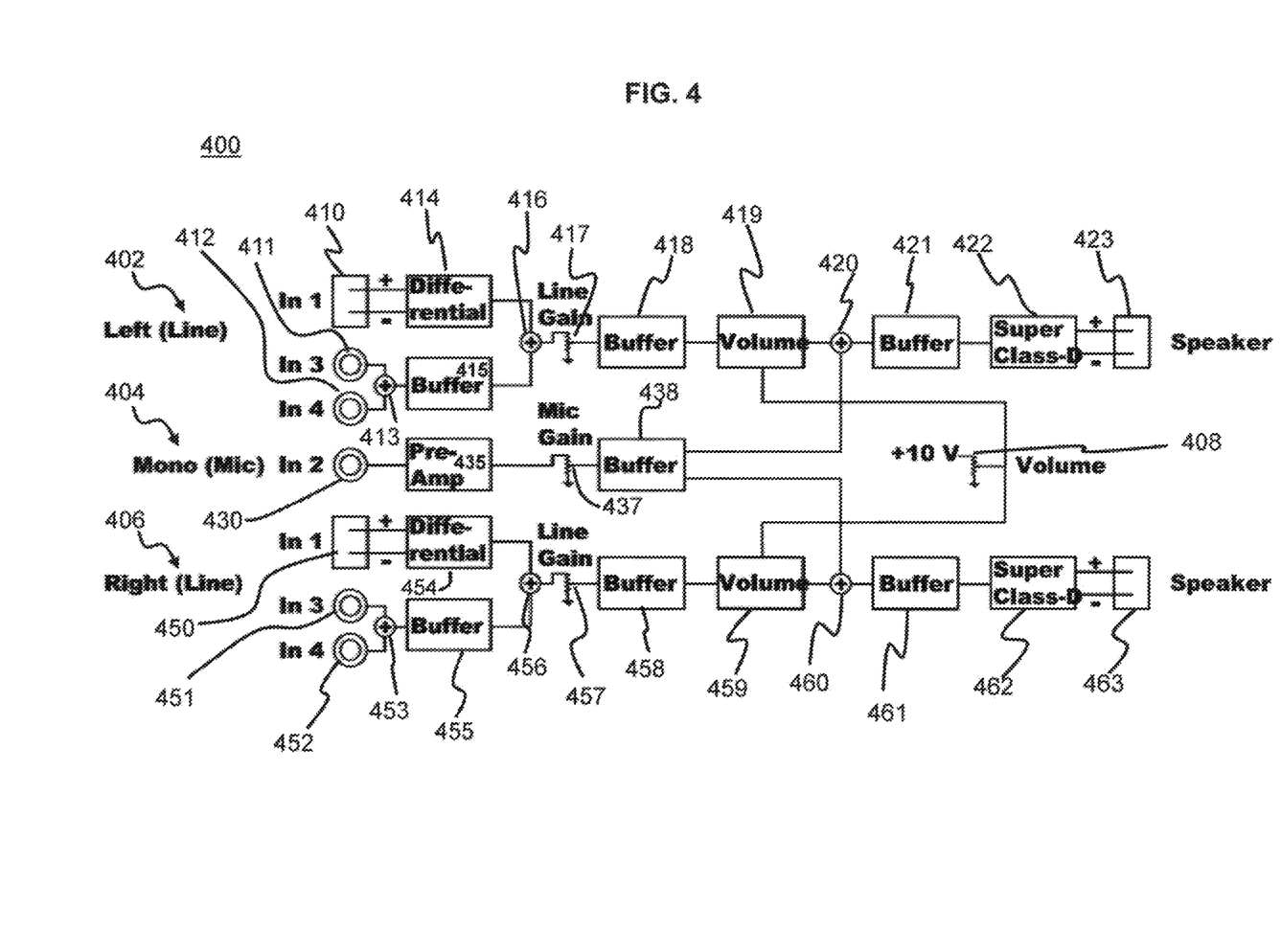
FIG. 4 schematically shows an example illustration of the current invention compact audio Power Amplifier's internal circuit block diagram.

Referring to FIG. 4, shown schematically is the internal circuit block diagram 400 of embodiments of the current invention compact Power Amp. The signal flows are grouped into three (3) pathways, the left channel signals 402 and the right channel signals 406 of the Line level input signals, and the microphone input signal 404. The right channel signal path is identical to the left channel signal path with identical items. The item numbers in the right channel are the equivalent left channel item numbers plus 40 (e.g. the right channel item number 459 is the equivalent left channel item number 419 plus 40). To avoid duplications; only described is the left channel signal path below, plus the microphone signal path. Input 1 Balanced signals from input connector 410 are converted to unbalanced signal by the differential operational amplifier (or Op Amp) 414. Input 3 signals from connector 411 and input 4 signals from connector 412 are mixed together by mixer 413, and go through a buffer 415, and then are mixed with the Input 1 signal from differential Op Amp 414 by the mixer 416. This final mixed signal is adjusted by the Line Gain Pot 417, and goes through a buffer 418, and then adjusted by the volume IC 419 which is controlled by the DC voltage from the external Volume Control Pot 408. This left channel signal then is mixed with the mono microphone signal by mixer 420. The mixed signal goes through buffer 421, into the Super Class D circuits 422, and finally drives the left speaker via connector 423. In other embodiments, a transformer is added between Super Class D circuits 422 and speaker 423 to raise the output voltage to 70 V or 100 V to drive speakers far away. This type of 70 V or 100 V Power Amp only has one channel output (mono). The right channel signal from buffer 458 is mixed with the left channel signal from buffer 418 together as mono signal and then goes through one circuit from item 419 through 423; while the other circuit from item 459 through 463 is not needed.

The mono microphone signal 404 comes in from connector 430, goes into a preamp 435, then the Mic Gain Pot 437, and a buffer 438 that splits it into two identical signals to be mixed into the left and right Line input signals by mixer 420 and 460 respectively. The mixing points are after the volume IC 419 and 459, thus this signal is not controlled by the Volume Control.

Super Class D Power Amp Circuit

Figure 5:
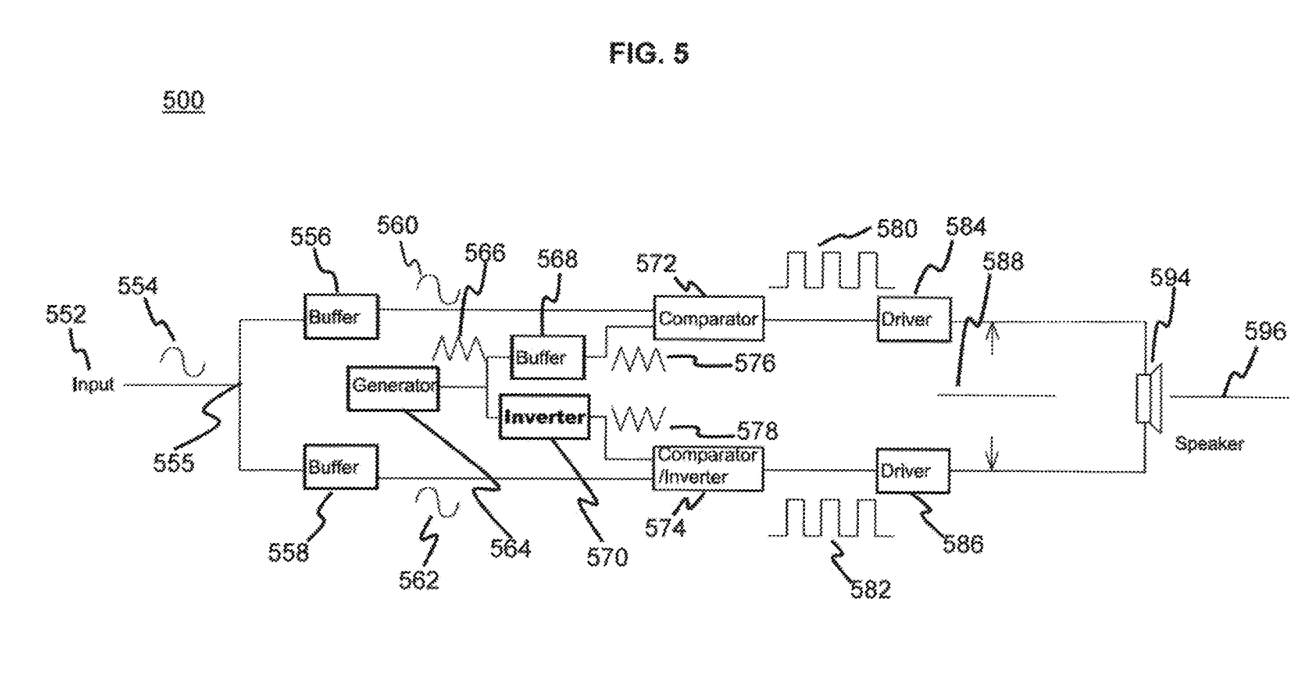
FIG. 5 schematically shows an example illustration of the current invention Super Class D Power Amp output stage circuit block diagram.

Now referring to FIG. 5, shown schematically is an embodiment of the current invention Super Class D Power Amp circuit output stage. This is the detailed internal diagram inside each of the item 422 or 462 in FIG. 4. The input signal 554 from input 552 is split into two paths by the analog splitter or simply copper wires junction 555, to two buffers 556 and 558 respectively. The buffer 556's output signal 560 is fed to one input of the comparator 572. The buffer 558's output signal 562 is fed to one input of the comparator/inverter 574. A 50-50 duty cycle triangle reference generator 564 generates triangle reference 566 and splits into two references 576 and 578 by buffer 568 and inverter 570, respectively. The buffer 568's output triangle reference 576 is fed to the other input of the comparator 572. The inverter 570's output triangle reference 578 is fed to the other input of the comparator/inverter 574. The comparator 572 uses signal 560 and triangle reference 576 to generate the PWM (Pulse Width Modulated) square wave signal 580. Similarly, the comparator/inverter 574 uses signal 562 and triangle reference 578 to generate the PWM square wave signal 582. The square wave signal 582 is in the same phase as square wave signal 580. These two square wave signals 580 and 582 have different pulse widths when there's an input signal 554. When there's no input signal 554, these two square waves 580 and 582 are identical in phase and pulse width. As a result, the differential output signal between the outputs of the drivers 584 and 586 is zero (or flat line on an oscilloscope) as show in item 588. This means there is no need for an output LC filter, and the signal 596 the speaker 594 gets when no input signal 554 is also a flat line. With the LC filler removed, no more space is occupied by and no more heat generated by the LC filter, thus the Super Class D Power Amps can be significantly smaller and cooler in operation. Although, the LC filter to filter out the Class D switching square wave signal is not needed, some much smaller optional filters may be present to filter out the EMI noises and can still be deployed in embodiments. This is not in conflict in the filterless embodiments of the current invention.

Remote DC Volume Control Circuit

Figure 6:
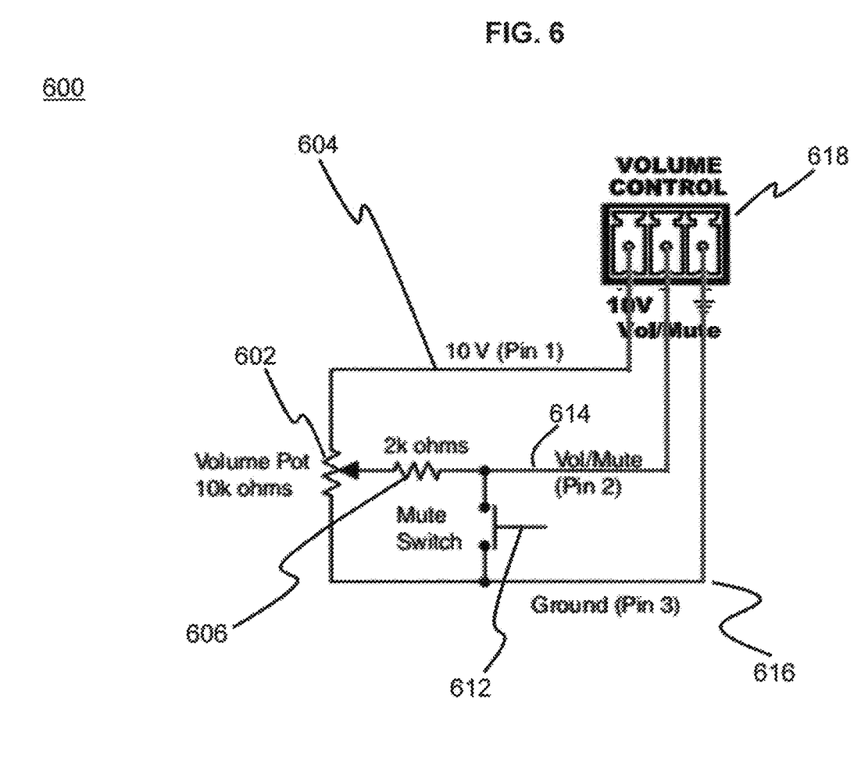
FIG. 6 schematically shows an example illustration of the current invention compact audio Power Amplifier's external remote volume and mute control circuit diagram.

Referring to FIG. 6, shown schematically is external remove Volume Control circuit 600 of embodiments of the current invention compact Power Amp. Embodiments of the current invention for compact Power Amp provides a 10 V DC reference voltage through connector 618's pin 1 via wire 604. A 10k ohm Potentiometer 602 changes the DC voltage on connector 618's pin 2 via wire 614 when the user turns the Pot, and this variable DC voltage is fed back to the Power Amp via connector 618 to control the volume. Skilled engineers would recognize the 10 V reference voltage can be 5 V, 12 V or other values. The 10k ohm Pot can be 5k, 20k ohms or other values.

Item 612 is a momentary push button switch for muting audio. When it's pressed, the wire 614 is shorted to ground wire 616, and the voltage on pin 2 of the connector 618 becomes zero, thus sound muting is achieved. Resister 606 serves the purpose of preventing the 10 V on wire 604 from being short circuited to the ground wire 616 when the push button 612 is pressed and the Pot 602 is at the maximum (top most) position.

What is claimed is:

1. A compact audio Power Amplifier comprising:
a thermal conductive enclosure comprising six flat exterior surfaces; no air ventilation space, and thereby there would be no internal air flow needed for dissipating heat from the power amplifier;
at least one thermal conducting material, wherein the material is chosen from the group consisting of, metal, alloy, ceramic, plastic, and hybrid materials having at least one side, each side having an inner and outer surface;
at least one circuit board comprising electronics components comprising at least one flat surfaces for heat dissipating; and
at least one thermal conductive component or layer positioned between the electronics components on the at least one flat surfaces of the circuitry on the circuit board and the inner surface of the thermal conductive enclosure by direct contact, wherein the material of the at least one thermal conductive component or layer is soft or hard or a combination thereof;
wherein the enclosure is about one inch in height, about four inches in width, about three to six inches in depth; and wherein the maximum total output power is about 100 W.

2. The compact circuit board of claim 1, wherein the circuitry, further comprises: a plurality of audio inputs; a plurality of speaker outputs; and a plurality of gain controls.

3. The audio inputs of claim 2, wherein the audio inputs are selected from a group consisting of a balanced input, unbalanced input, and a microphone input.

4. The audio inputs of claim 2, wherein the balances input, unbalanced input and microphone inputs are mixed together via the circuitry on the circuit board.

5. The compact audio Power Amplifier of claim 1, wherein the circuit board further comprises a remote Volume Control port circuit that uses external Potentiometer to supply a variable DC voltage to control the Volume.

6. The external remote Volume Control circuit for the Volume Control port of claim 5, further comprising a Volume Potentiometer, a short circuit prevention Resister and a Mute Switch.

7. The circuit board of the compact audio Power Amplifier of claim 1, wherein the circuitry, further comprising separated Line Gain and Mic Gain adjustment Pots.

8. The Line Gain and Mic Gain of claim 7, wherein the output signal strength from the microphone input is only controlled by the Mic Gain control and not by the Volume Control, while the output signal strength from the Balanced/unbalanced Line and Unbalanced Line inputs are controlled by both the Line Gain control and Volume Control.

9. The Power Amplifier of claim 1, wherein the enclosure has a plurality of surfaces.

10. A compact audio Power Amplifier comprising, circuitry, wherein the circuitry further comprises Super Class D Power Amplification circuits, the Super Class D Power Amplification circuits further comprising two parallel switching amplification circuits per audio channel;
one analog splitter or simply a copper wire junction, wherein the analog splitter or simply a copper wire junction splits the input analog signal into two identical analog signals wherein one signal connects to a first buffer and a comparator and a first driver circuit and wherein the other signal connects to a second buffer and a comparator/inverter and a second driver circuit; a triangle reference generator, wherein the triangle reference generator feeds the references to,
a splitter for splitting the triangle wave reference into a first and second reference; wherein the first reference connects to;
a third buffer for output to;
a comparator for generating a square wave for output to the first driver circuit;
and wherein the second reference connects to;
an inverter for output to a comparator/inverter for generating a square wave for output to the second driver circuit;

wherein the first and second driver circuits output square wave signals that are in phase, and are identical in wave width, amplitude and phase for every cycle when there is no input signal, thus no differential signals are present for the speaker connected between the outputs of these two circuits when no input signal; and no switching signal LC filter.

11. A compact audio Power Amplifier comprising, a heat sink and circuitry, the heat sink further comprising;
no internal air space needed for ventilation;
a thermal conducting enclosure with six flat exterior surfaces;
a circuit board comprising electronics components and a flat surface;
at least one thermal conducting material in contact between the flat surface of the circuit board and the enclosure;
the electronics components further comprising a Super Class D Power Amplification circuit, the circuit further comprising two parallel switching amplification circuits per audio channel;
one analog splitter or simply a copper wire junction, wherein the analog splitter or simply a copper wire junction splits the input analog signal to two identical analog signals to feed the two parallel switching amplifier circuits;
one triangle reference generator, wherein the triangle reference generator feeds the reference to the two parallel switching amplification circuits in reversed phase, wherein the circuit output square wave signals that are in phase, and are identical in wave width, amplitude and phase for every cycle when no input signal, thus no differential signals are present for the speaker connected between the outputs of these two circuits when on input signal; and
no switching square wave LC filter at the power amp output circuitry.

12. A compact audio Power Amplifier comprising:
a thermal conductive enclosure comprising six flat exterior surfaces; no air ventilation space, and thereby there would be no internal air flow needed for dissipating heat from the power amplifier;
at least one thermal conducting material, wherein the material is chosen from the group consisting of, metal, alloy, ceramic, plastic, and hybrid materials having at least one side, each side having an inner and outer surface;
at least one circuit board comprising electronics components comprising at least one flat surface for heat dissipating; and
at least one thermal conductive component or layer positioned between the electronics components on the at least one flat surfaces of the circuitry on the circuit board and the inner surface of the thermal conductive enclosure by direct contact, wherein the material of the at least one thermal conductive component or layer is soft or hard or a combination thereof;
wherein the enclosure is about 0.5 to 1 inch in height, about 3 to 6 inches in width, about 3 to 6 inches in depth; and wherein the maximum total output power is about 50 to 200 W;
Alternatively, wherein the enclosure is about 1 to 2 inch in height, about 6 to 10 inch in width, about 6 to 12 inch in depth; and the wherein the maximum total output power is about 200 to 500 W.

* * * * *